United States Patent
Zhang et al.

(10) Patent No.: US 6,555,456 B2
(45) Date of Patent: Apr. 29, 2003

(54) METHOD OF FORMING IRIDIUM CONDUCTIVE ELECTRODE/BARRIER STRUCTURE

(75) Inventors: Fengyan Zhang, Vancouver, WA (US); Jer-shen Maa, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/037,192

(22) Filed: Nov. 9, 2001

(65) Prior Publication Data

US 2002/0113314 A1 Aug. 22, 2002

Related U.S. Application Data

(62) Division of application No. 09/263,595, filed on Mar. 5, 1999.

(51) Int. Cl.[7] ............... H01L 21/3205; H01L 21/28

(52) U.S. Cl. ............... 438/585; 438/605; 438/592

(58) Field of Search ............... 438/585, 605, 438/592

(56) References Cited

U.S. PATENT DOCUMENTS

| | | | | |
|---|---|---|---|---|
| 5,858,182 | A | * | 1/1999 | Horng et al. |
| 6,225,185 | B1 | * | 5/2001 | Yamazaki et al. |
| 6,376,374 | B1 | * | 4/2002 | Stevens |
| 6,407,422 | B1 | * | 6/2002 | Asano |
| 6,423,592 | B1 | * | 7/2002 | Sun |

* cited by examiner

*Primary Examiner*—John F. Niebling
*Assistant Examiner*—Stanetta Isaac
(74) *Attorney, Agent, or Firm*—David C. Ripma; Matthew D. Rabdau; Scott C. Krieger

(57) ABSTRACT

A conductive barrier, useful as a ferroelectric capacitor electrode, having high temperature stability has been provided. This conductive barrier permits the use of iridium (Ir) metal in IC processes involving annealing. Separating silicon substrate from Ir film with an intervening, adjacent, tantalum (Ta) film has been found to very effective in suppressing diffusion between layers. The Ir prevents the interdiffusion of oxygen into the silicon during annealing. A Ta or TaN layer prevents the diffusion of Ir into the silicon. This Ir/TaN structure protects the silicon interface so that adhesion, conductance, hillock, and peeling problems are minimized. The use of Ti overlying the Ir/TaN structure also helps prevent hillock formation during annealing. A method of forming a multilayer Ir conductive structure and Ir ferroelectric electrode are also provided.

24 Claims, 6 Drawing Sheets

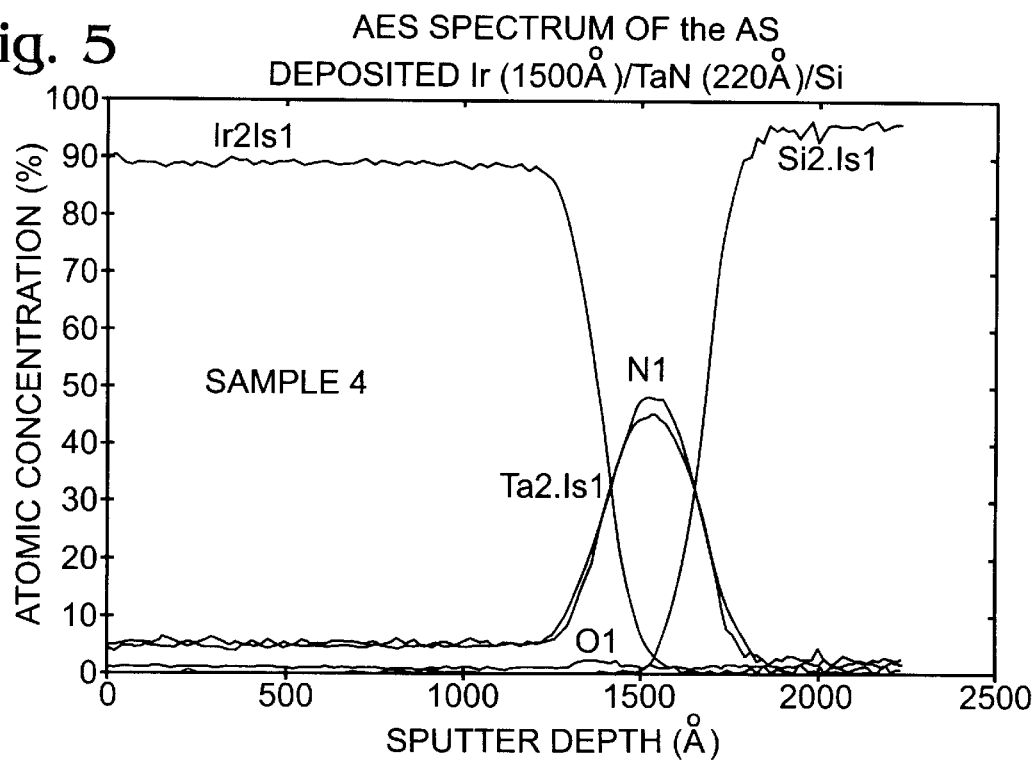
Fig. 5  AES SPECTRUM OF the AS DEPOSITED Ir (1500Å)/TaN (220Å)/Si
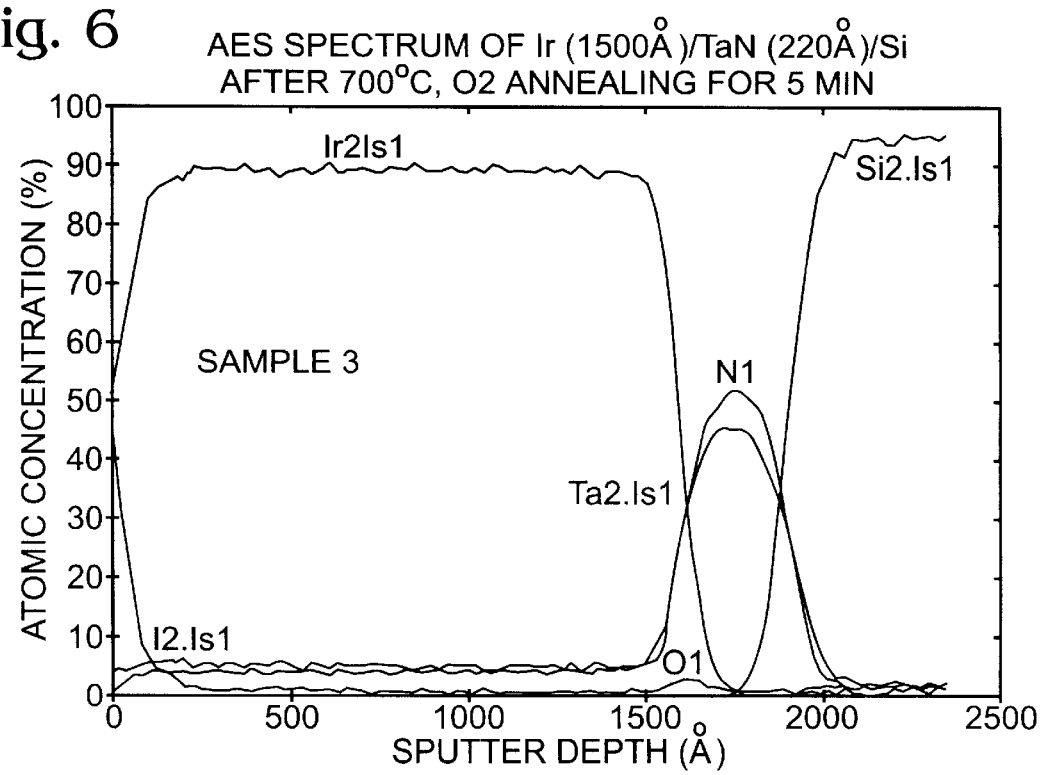
Fig. 6  AES SPECTRUM OF Ir (1500Å)/TaN (220Å)/Si AFTER 700°C, O2 ANNEALING FOR 5 MIN Ir(2000Å)/TaN(250Å)/Si, RTA, 700°C, 5min, $O_2$ Ti(80Å)/Ir(2000Å)/TaN(250Å)Si, RTA, 700°C, 5min, $O_2$ CONTACT RESISTANCE OF Si/Ta(350Å)/TaN(350Å)Ir(1500Å) UNDER $O_2$ ANNEALING FOR 5 MIN AT DIFFERENT TEMPERATURE, HOLE SIZE=1.5μm CONTACT RESISTANCE CHANGE OF Si/TaN(350Å)Ir(1500Å) UNDER $O_2$ ANNEALING FOR 5 MIN AT DIFFERENT TEMPERATURE, HOLE SIZE=1.5μm

METHOD OF FORMING IRIDIUM CONDUCTIVE ELECTRODE/BARRIER STRUCTURE

CROSS REFERENCE TO RELATED APPLICATIONS

This application is a divisional of application Ser. No. 09/263,595, filed Mar. 5, 1999, entitled "Iridium Conductive Electrode/Barrier Structure and Method for Same," invented by Fengyan Zhang et al.

BACKGROUND AND SUMMARY OF THE INVENTION

The present invention is generally related to the fabrication of integrated circuits (ICs) and, more specifically, to the fabrication of a conductive barrier using iridium (Ir) and tantalum (Ta), for use as an electrode in a ferroelectric device.

Platinum (Pt) and other noble metals are used in IC ferroelectric capacitors. The use of noble metals is motivated by their inherent chemical resistance. This property is especially desirable under high temperature oxygen annealing conditions, such as those seen in the fabrication of ferroelectric capacitors. In addition, chemical interaction between noble metals and ferroelectric materials such as perovskite metal oxides, is negligible.

Specifically, the above-mentioned noble metals are used as conductive electrode pairs separated by a ferroelectric material. One, or both of the electrodes are often connected to transistor electrodes, or to electrically conductive traces in the IC. As is well known, these ferroelectric devices can be polarized in accordance with the voltage applied to the electrode, with the relationship between charge and voltage expressed in a hysteresis:loop. When used in memory devices, the polarized ferroelectric device can be used to represent a "1" or a "0". These memory devices are often called ferro-RAM, or FRAM. Ferroelectric devices are nonvolatile. That is, the device remains polarized even after power is removed from the IC in which the ferroelectric is imbedded.

There are problems in the use of metal, even noble metal electrodes. Pt, perhaps the widely used noble metal, permits the diffusion of oxygen, especially during high temperature annealing processes. The diffusion of oxygen through Pt results in the oxidation of the neighboring barrier and substrate material. Typically, the neighboring substrate material is silicon or silicon dioxide. Oxidation can result in poor adhesion between the Pt and neighboring layer. Oxidation can also interfere with the conductivity between neighboring substrate layers. Silicon substrates are especially susceptible to problems occurring as a result of oxygen diffusion. The end result may be a ferroelectric device with degraded memory properties. Alternately, the temperature of the IC annealing process must be limited to prevent the degradation of the ferroelectric device.

Various strategies have been attempted to improve the interdiffusion, adhesion, and conductivity problems associated with the use of noble metals as a conductive film in IC fabrication. Titanium (Ti), titanium oxide ($TiO_2$), and titanium nitride (TiN) layers have been interposed between a noble metal and silicon (Si) substrates to suppress the interdiffusion of oxygen. However, Ti layers are generally only effective below annealing temperatures of 600 degrees C. After a 600 degree C. annealing, Pt diffuses through the Ti layer to react with silicon, forming a silicide product. Further, the Pt cannot stop the oxygen diffusion. After a high temperature annealing, a thin layer of silicon oxide may be formed on the silicon surface, which insulates contact between silicon and the electrode.

Other problems associated with the annealing of a Pt metal film are peeling and hillock formation. Both these problems are related to the differences in thermal expansion and stress of Pt with neighboring IC layers during high temperature annealing. A layer of Ti overlying the Pt film is known to reduce stress of the Pt film, suppressing hillock formation.

Ir has also been used in attempts to solve the oxygen interdiffusion problem. Ir is chemically stable, having a high melting temperature. Compared to Pt, Ir is more resistant to oxidation and oxygen diffusion. Further, even when oxidized, iridium oxide remains conductive. When layered next to Ti, the Ir/Ti barrier is very impervious to oxygen interdiffusion. However, Ir can diffuse through Ti. Like Pt, Ir is very reactive with silicon or silicon dioxide. Therefore, a bilayered Ir/Ti or Ir/TiN barrier is not an ideal barrier metal.

Co-pending application Ser. No. 09/263,970, entitled "Iridium Composite Barrier Structure and Method for Same", invented by Zhang et al., and filed on Mar. 5, 1999, discloses a Ir composite film that is resistant to interdiffusion.

It would be advantageous if a method were developed for the use of Ir as a conductor, conductive barrier, or electrode in IC fabrication. It would be advantageous if the Ir could be used without interaction to an underlying Si substrate.

It would be advantageous if Ir film could be layered with an interposing film to prevent the interaction of Ir with a silicon substrate. It would be advantageous if the multilayered film including a layer of Ir could resist the interdiffusion of oxygen at high annealing temperatures. It would also be advantageous if the multilayered film including Ir was not susceptible to peeling problems and hillock formation.

Accordingly, a conductive barrier or electrode is provided comprising an underlying silicon substrate, a first barrier film including tantalum (Ta) overlying the substrate, and an iridium (Ir) film, having a thickness in the range of approximately 20 to 200 nanometers (nm), overlying the first barrier film. The combination of the Ir film and the first barrier film is resistant to the interdiffusion of oxygen into the silicon. In some aspects of the invention, a titanium (Ti) film overlies the Ir film. The Ti layer has a thickness in the range of approximately 5 to 25 nm. The Ti film suppresses the formation of hillock regions at high annealing temperatures.

The first barrier film is selected from the group of materials consisting of Ta and tantalum nitride (TaN), and has a thickness in the range of approximately 10 to 100 nanometers (nm).

In some aspects of the invention, a second barrier layer is interposed between the first barrier layer and the silicon substrate. Typically, the first barrier layer is TaN and the second barrier layer is Ta. The first and second barrier layers have a combined thickness in the range of approximately 20 to 200 nm, with the second barrier layer thickness being in the range of approximately 10 to 100 nm.

The above-described conductive barrier is well suited to the formation of ferroelectric devices, where the conductive barrier acts as at least one of the electrodes. Then, a ferroelectric film overlies the Ir film, and a conductive metal film, which can be a multilayered film, overlies the ferroelectric film. In this manner, the ferroelectric film can be annealed at high temperatures in an oxygen ambient conditions to enhance its memory related charge storage characteristics.

A method for forming a highly temperature stable conductive barrier overlying an integrated circuit substrate is also provided. The method comprising the steps of:

a) depositing a first barrier layer including tantalum (Ta) overlying the substrate; and b) depositing an iridium (Ir) film overlying the first barrier layer, whereby a multilayer structure is formed that is resistive to interaction with the substrate.

Optionally, a further step, follows Step b), of:

c) depositing a layer of titanium (Ti) overlying the Ir electrode, whereby the formation of hillocks is suppressed.

Step a) includes depositing the first barrier layer through deposition methods selected from the group consisting of chemical vapor deposition (CVD), physical vapor deposition (PVD), including sputtering, and metal organic CVD (MOCVD). When deposited by PVD sputtering, a 1:X flow of Ar to $N_2$ is used, where X is greater then, or equal to 1.

Step b) includes depositing the Ir film at a temperature in the range of approximately 200 to 500 degrees C., using deposition methods from the group consisting of PVD, CVD, and MOCVD.

In one aspect of the invention, a further step follows Step c), of:

c1) annealing the layers deposited in Steps b) and c) at a temperature in the range of approximately 600 to 800 degrees C. in atmospheric conditions selected from the group consisting of Ar and vacuum ambient.

BRIEF DESCRIPTION OF THE DRAWINGS

FIGS. 5 and 6 illustrate an Auger Electron Spectroscopy (AES) spectrum of a conductive barrier film of the present invention before and after annealing.

DETAILED DESCRIPTION OF THE PREFERRED EMBODIMENT

Figure 1:
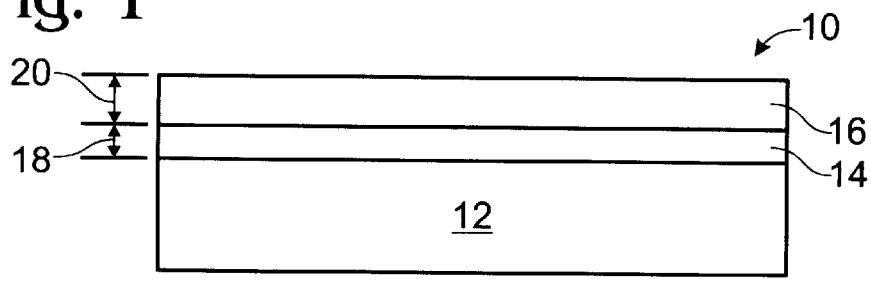
FIGS. 1–4 illustrate steps in the formation of a completed conductive barrier layer in an integrated circuit.

FIGS. 1–4 illustrate steps in the formation of a completed conductive barrier layer in an integrated circuit. Conductive barrier 10 is suited for use as an electrode, especially an electrode in a ferroelectric device. FIG. 1 illustrates the conductive barrier 10. Conductive barrier 10 comprises a substrate 12, a first barrier film including tantalum (Ta) 14 overlying substrate 12, and an iridium (Ir) film 16 overlying first barrier film 14. The combination of Ir film 16 and first barrier film 14 is resistant to the interdiffusion of oxygen into substrate 12.

Substrate 12 is selected from the group of materials consisting of silicon, polysilicon, silicon dioxide, and silicon-germanium compounds. First barrier layer 14 prevents the formation of Ir silicide products. First barrier film 14 is selected from the group of materials consisting of Ta and tantalum nitride (TaN). First barrier layer 14 has a thickness 18 in the range of approximately 10 to 100 nanometers (nm). Ir film 16 has a thickness 20 in the range of approximately 20 to 200 nm.

Figure 2:
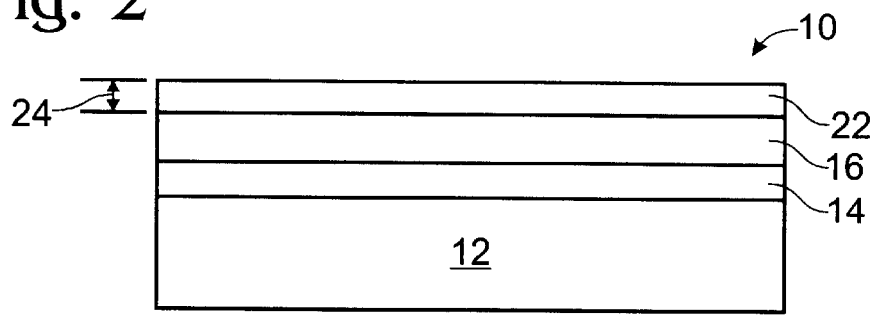

FIG. 2 illustrates the addition of a hillock suppression layer. Titanium (Ti) film 22 overlies Ir film 16. Ti film 22 suppresses the formation of hillock regions at high annealing temperatures. Ti layer 22 has a thickness 24 in the range of approximately 5 to 25 nm. Preferably, thickness 24 is less than approximately 10 nm.

Figure 3:
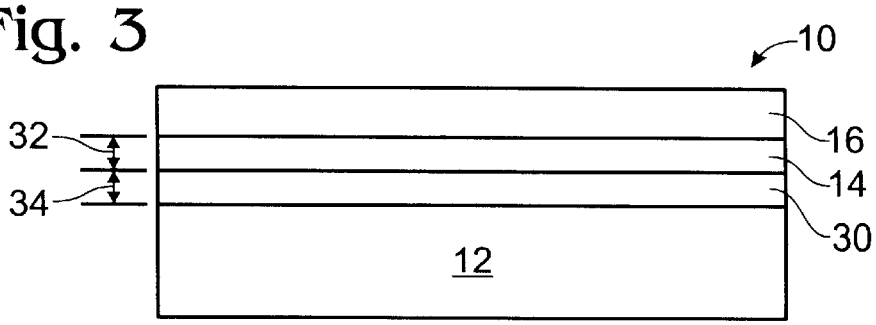

FIG. 3 illustrates an alternated preferred embodiment of the multilayer conductive barrier of the present invention. A second barrier layer 30 is interposed between first barrier layer 14 and substrate 12. Typically, first barrier layer 14 is TaN and second barrier layer 30 is Ta. First barrier layer 14 and second barrier layer 30 have a combined thickness 32 in the range of approximately 20 to 200 nm. Second barrier layer 30 has a thickness 34 in the range of approximately 10 to 100 nm.

Figure 4:
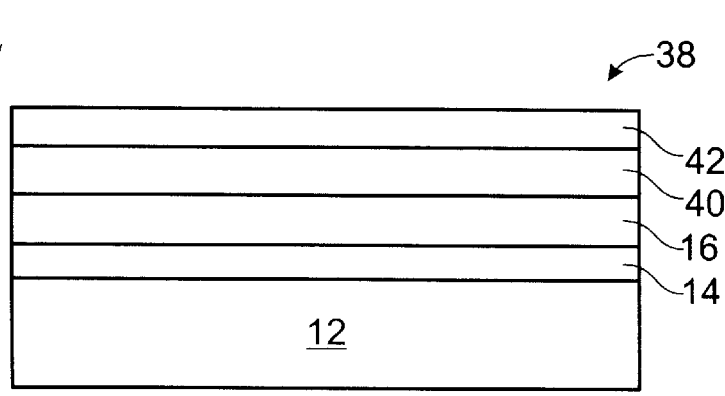

FIG. 4 illustrates a ferroelectric device 38 where conductive barrier 10 of FIG. 1 is used as a ferroelectric device electrode. A ferroelectric film 40 overlies Ir film 16. A conductive metal film 42 overlies ferroelectric film 40. Conductive metal film 42 is a multilayered electrode in some aspects of the invention. Alternately, but not shown, conductive metal film 42 is a conductive barrier, as conductive barrier 10, described above. In another alternative, not shown, Ti layer 22 overlies Ir layer 16, as in FIG. 2. Ferroelectric film 40 is capable of storing charges for memory applications between said top 42 and Ir 16 electrodes. In some aspects of the invention, second barrier 30 (not shown) separates first barrier 14 from substrate 12, as in FIG. 3.

FIGS. 5 and 6 illustrate an Auger electron spectroscopy (AES) spectrum of a conductive barrier film of the present invention before and after annealing. The AES spectrum is used to characterize elemental composition. When used in conjunction with ion sputtering, AES can characterize a sample in depth. Specifically, FIG. 5 is the AES spectrum of an Ir/TaN barrier before annealing. The "/" symbol, as used herein, signifies a layering of distinct films. FIG. 6 is the AES spectrum after annealing. Of special interest is the distribution pattern of the Ta and N. The lack of change in the Ta and N distribution indicates that no interdiffusion has occurred between the Ir and TaN layer as a result of the 700 degree C. oxygen annealing, and also shows that no interdiffusion has occurred between the TaN and Si. Likewise, FIGS. 5 and 6 also indicate no interdiffusion between the Ir, TaN, and Si layers.

Figure 7:
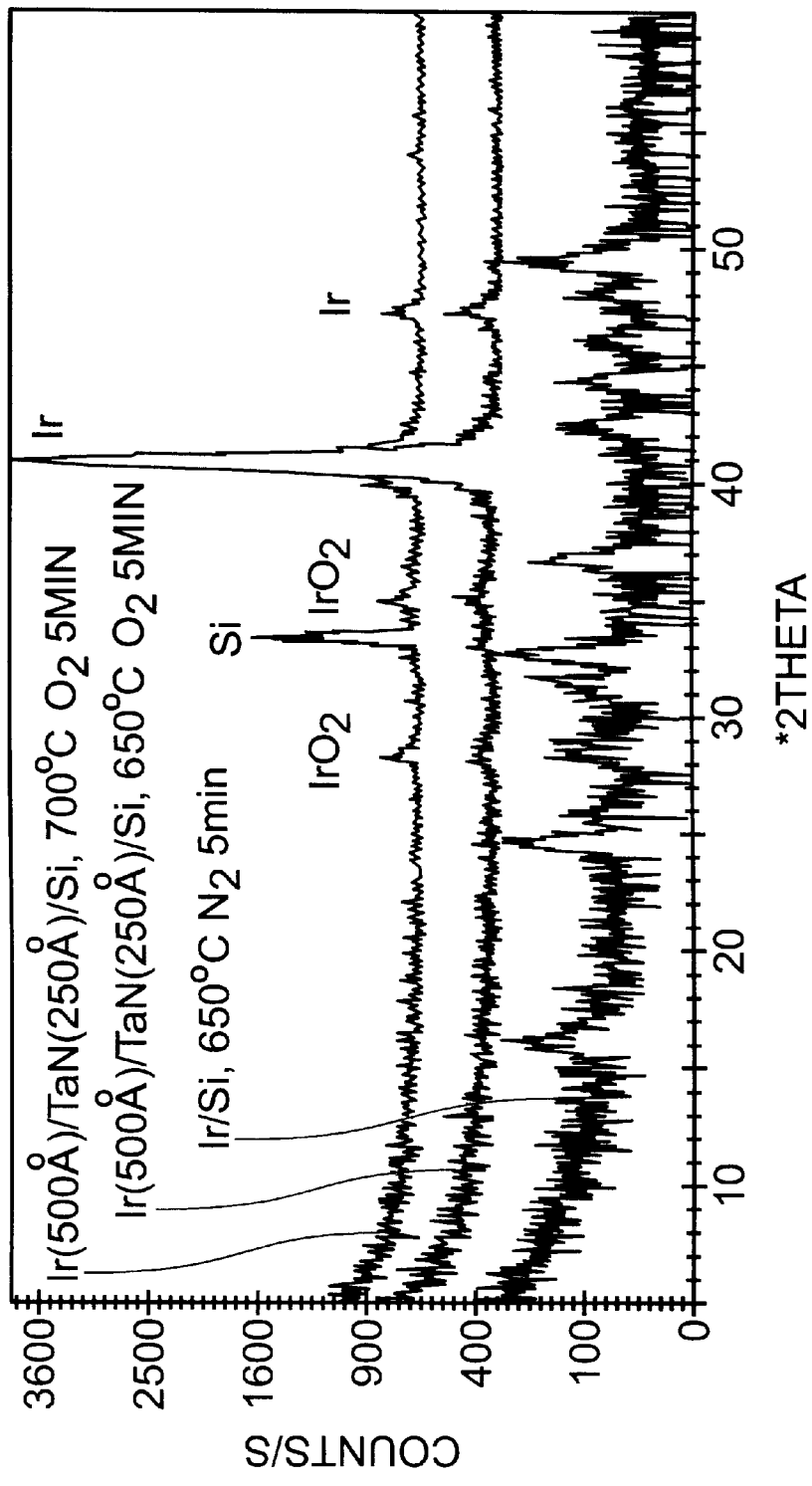
FIG. 7 illustrates an X-ray diffraction (XRD) spectrum of the present invention barrier layer, before and after annealing.

FIG. 7 illustrates an X-ray diffraction (XRD) spectrum of the present invention barrier layer, before and after annealing. The bottom spectrum represents the case where a layer of Ir is deposited on silicon, and annealed at 650 degrees C. The iridium film has totally reacted with the Si, forming iridium silicide. The middle spectrum represents a Ir/TaN/Si barrier of the present invention which has been annealed at 650 degrees C. at oxygen ambient. No iridium silicide peaks are present, indicating no reaction between Ir and Si. The top spectrum is the Ir/TaN/Si barrier annealed at 700 degrees C. No iridium silicide peaks are observed. The only peak of Si observed is believed to be due to hillock formation, which exposes areas of the Si layer.

Figure 8:
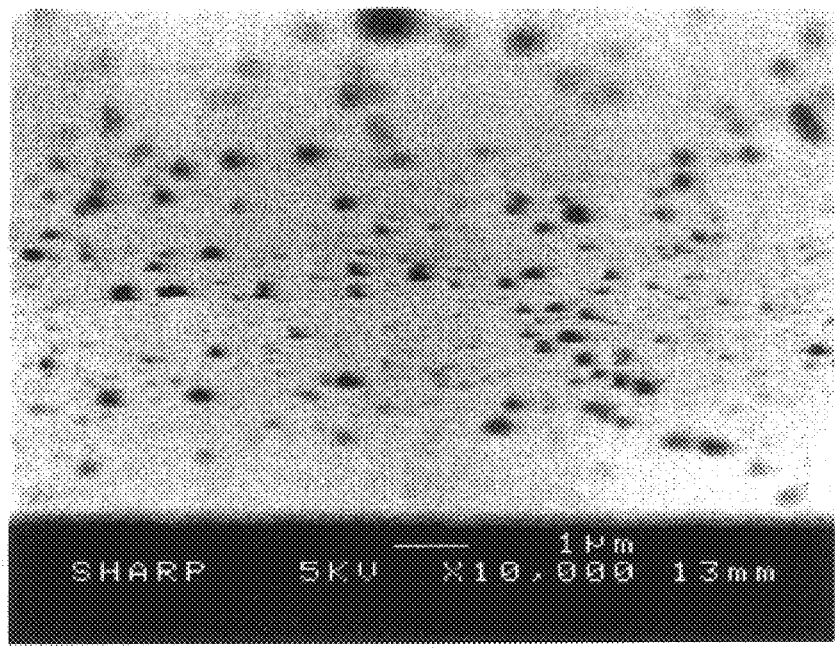
FIGS. 8 and 9 illustrate the suppression of hillocks in the present invention barrier layer with the use of an overlying Ti layer.
Figure 9:
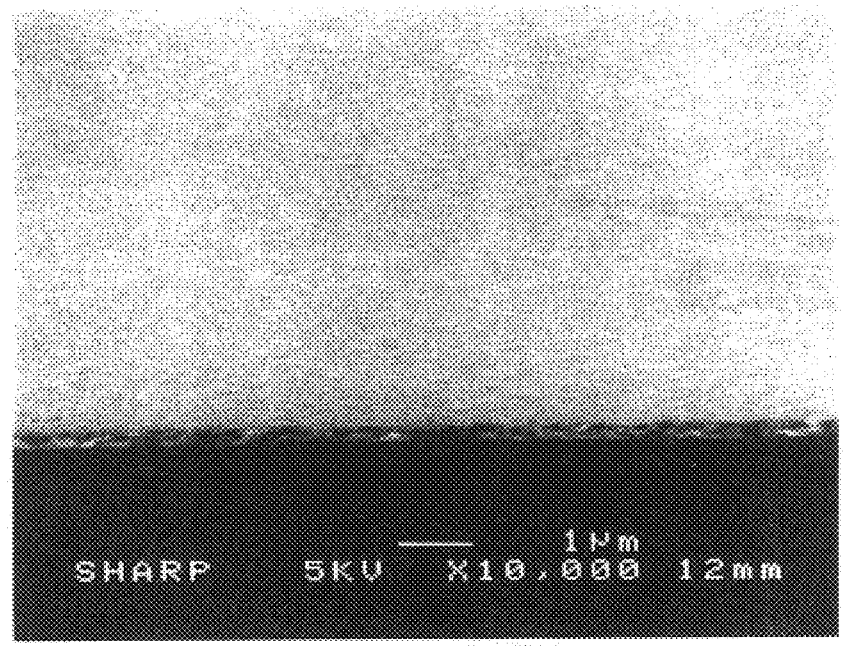

FIGS. 8 and 9 illustrate the suppression of hillocks in the present invention barrier layer with the use of an overlying Ti layer. FIG. 8 illustrates an Ir/TaN/Si barrier where hillocks have occurred as a result of 700 degree annealing in an oxygen ambient environment. FIG. 9 depicts the suppress of hillocks possible when the same film has an overlying Ti layer of approximately 8 nm.

Figure 10:
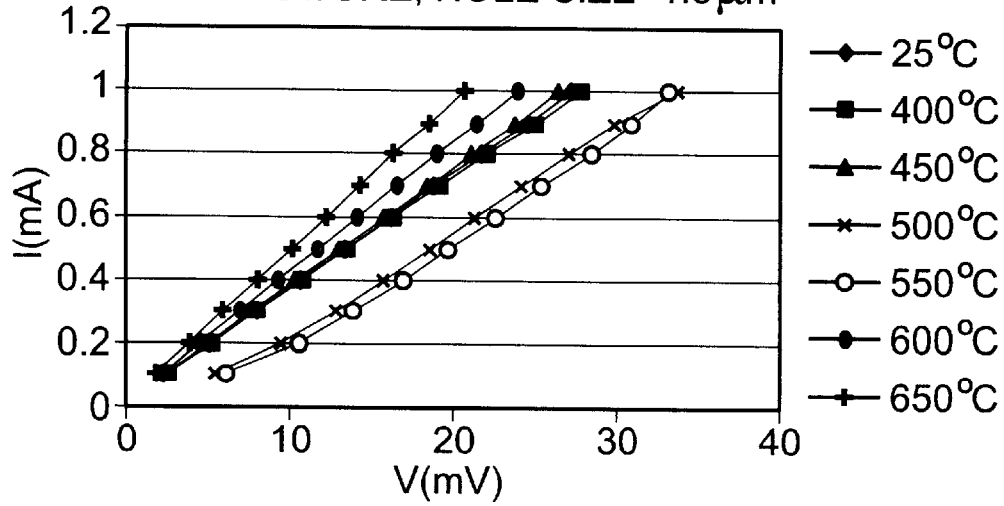
FIGS. 10 and 11 illustrate the ohmic contact property of the present invention barrier after oxygen ambient, five minute annealing, at a variety of temperatures.
Figure 11:
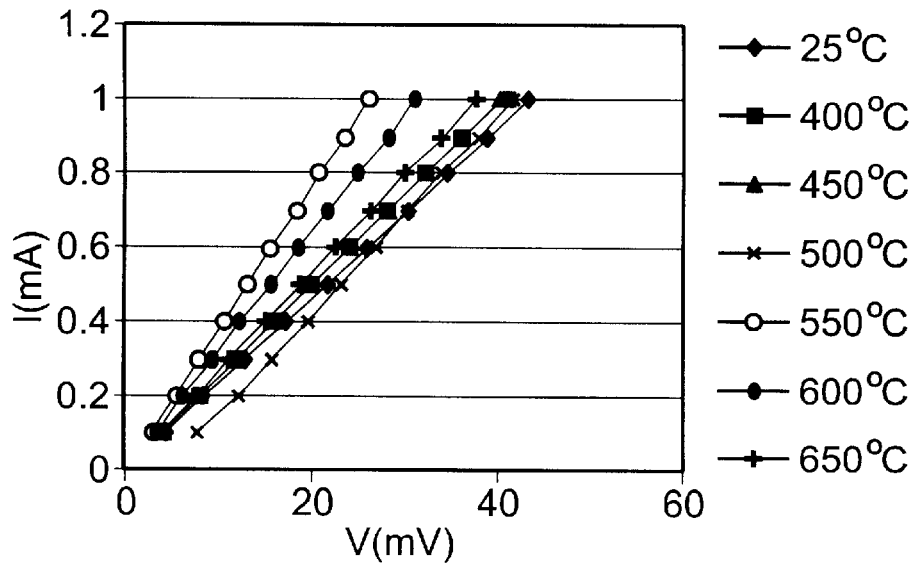

FIGS. 10 and 11 illustrate the ohmic contact property of the present invention barrier after oxygen ambient, five minute annealing, at a variety of temperatures. FIG. 10 depicts the ohmic contact property of a barrier where Ir overlies TaN, TaN overlies Ta, and Ta overlies Si. FIG. 11 depicts the ohmic contact property of a Ir/TaN barrier overlying Si at various annealing temperatures. It can be seen that after 650 degree C. oxygen annealing for 5 minutes, both films maintain good ohmic contact with the Si substrate. That is, good electrical contact between the silicon and barrier metal remains, even after high temperature annealing.

Figure 12:
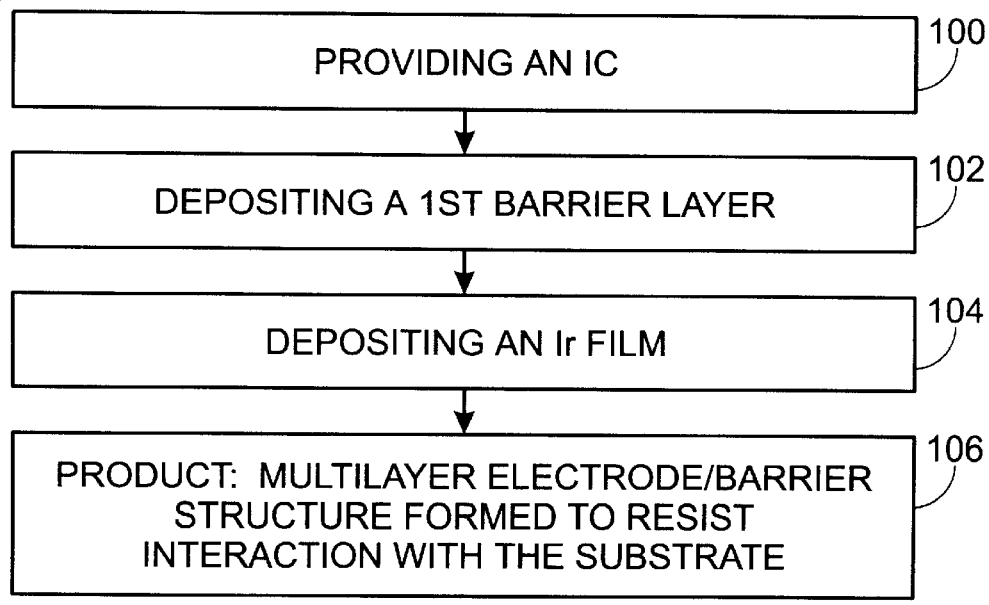
FIG. 12 is a flowchart illustrating a method for forming a highly temperature stable conductive barrier.

FIG. 12 is a flowchart illustrating a method for forming a highly temperature stable conductive barrier. Step 100 provides an integrated circuit substrate. The substrate material is selected from the group of materials consisting of silicon, polysilicon, silicon dioxide, and silicon-germanium compounds. Step 102 deposits a first barrier layer including tantalum (Ta) overlying the substrate. Step 102 includes depositing a first barrier selected from the group of materials consisting of Ta and tantalum nitride (TaN). Step 102 includes depositing the first barrier layer through deposition methods selected from the group consisting of chemical vapor deposition (CVD), physical vapor deposition (PVD), including sputtering, and metal organic CVD (MOCVD). Typically, Step 102 includes depositing TaN in a nitrogen rich environment, forming TaNx, where 1<X<2, whereby the barrier properties and adhesion properties are improved. When the first barrier is deposited by PVD sputtering, Step 102 includes using a 1:X flow of Ar to $N_2$, where X is greater then, or equal to 1.

Step 104 deposits an iridium (Ir) film overlying the first barrier layer. Step 104 includes depositing the Ir film at a temperature in the range of approximately 200 to 500 degrees C., using deposition methods selected from the group consisting of PVD, CVD, and MOCVD 23. Step 104 includes the Ir film being deposited at a thickness in the range of approximately 20 to 200 nm. Step 106 is a product, where a multilayer barrier structure is formed that is resistive to interaction with the substrate.

Some aspects of the invention include a further step, following Step 104. Step 105 (not shown) deposits a layer of titanium (Ti) overlying the Ir film, whereby the formation of hillocks is suppressed. Step 105 includes depositing the Ti layer with deposition methods selected from the group consisting of PVD, MOCVD, and CVD. The Ti layer is deposited to a thickness in the range of approximately 5 to 25 nm, preferably the thickness is less than 10 nm. A thinner layer of Ti lessens the interaction between the Ti and the upper ferroelectric material, minimizing the formation of titanium oxide (TiO). In some aspects of the invention, a further step follows step 104. Step 105a, not shown, anneals the layers deposited in Steps 104 and 105 at a temperature in the range of approximately 600 to 800 degrees C., in atmospheric conditions selected from the group consisting of Ar and vacuum ambient.

In some aspects of the invention, a further step precedes Step 102. Step 100a, not shown, deposits a second barrier layer overlying the substrate. The second barrier layer material is selected from the group consisting of Ta and TaN. The second barrier layer is deposited through deposition means selected from the group consisting of CVD, MOCVD, and PVD. When sputtered (a form of PVD), Step 100a deposits TaN with a 1:X flow of Ar to $N_2$, where X is less than 1. Step 100a includes depositing the second barrier layer to a thickness in the range of approximately 10 to 100 nm. Steps 100a and 102 include depositing first and second barrier layers to have a combined thickness in the range of approximately 20 to 200 nm.

Figure 13:
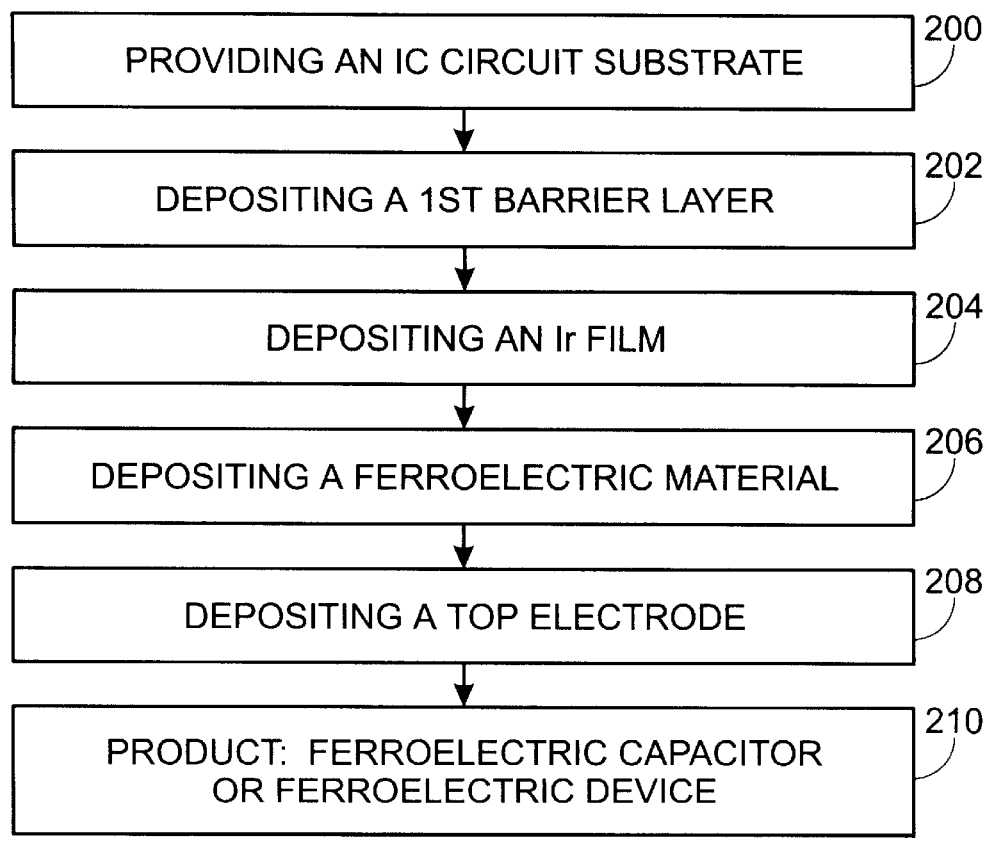
FIG. 13 is a flowchart illustrating a method of forming a ferroelectric device.

FIG. 13 is a flowchart illustrating a method of forming a ferroelectric device, such as a ferroelectric capacitor. Step 200 provides an integrated circuit substrate. Step 202 deposits a first barrier layer including tantalum (Ta) overlying the substrate. Step 204 deposits an iridium (Ir) film overlying the first barrier layer. In some aspects of the invention, not shown, Step 205 deposits a Ti layer overlying the Ir film is layer deposited in Step 204. Step 206 deposits a ferroelectric material overlying the Ti layer, when the Ti layer is used. Alternately, Step 206 deposits a ferroelectric material overlying the Ir film. Step 208 deposits a conductive top electrode overlying the ferroelectric material. Conductive top electrode is any suitable electrical conductant, including the Ir conductive barrier described above, or a multilayer conductive electrode. Step 210 is a product, where a ferroelectric capacitor, or other ferroelectric device, is formed.

A ferroelectric electrode, or conductive barrier has been provided to permit the use of Ir in high temperature IC fabrication processes. Separating silicon substrate from the Ir has been found to very effective in the suppression of interdiffusion. The Ir prevents the interdiffusion of oxygen into the silicon during annealing. A Ta or TaN layer prevents the diffusion of Ir into the silicon. This Ir/TaN structure protects the silicon interface so that adhesion, conductance, hillock, and peeling problems are minimized. The use of Ti overlying the Ir/TaN structure helps prevent hillock formation during annealing. Other variations the above-mentioned Ir/TaN structure will occur to those skilled in the art.

What is claimed is:

1. A method for forming a high temperature stable conductive barrier overlying an integrated circuit substrate, the method comprising the steps of:

a) depositing a first barrier layer including tantalum (Ta) overlying the substrate;

b) depositing an iridium (Ir) film overlying the first barrier layer, whereby a multilayer barrier structure is formed that is resistive to interaction with the substrate; and c) depositing a layer of titanium (Ti) overlying the Ir film, whereby the formation of hillocks is suppressed.

2. A method as in claim 1 wherein a ferroelectric capacitor is formed, including further steps, following Step c), of:

d) depositing a ferroelectric material overlying the Ti layer; and e) depositing a conductive top electrode overlying the ferroelectric material, whereby a ferroelectric capacitor is formed.

3. A method as in claim 1 in which Step a) includes depositing a first barrier selected from the group of materials consisting of Ta and tantalum nitride (TaN).

4. A method as in claim 3 in which Step a) includes depositing the first barrier layer through deposition methods selected from the group consisting of CVD, PVD, and MOCVD.

5. A method as in claim 4 in which Step a) includes depositing the first barrier by PVD sputtering, with a 1:X flow of Ar to $N_2$, where X is greater than, or equal to 1.

6. A method as in claim 5 including a further step, preceding Step a), of:

depositing a second barrier layer overlying the substrate, the second barrier layer material being from the group consisting of Ta and TaN, and deposited through deposition means selected from the group consisting of CVD, MOCVD, and PVD.

7. A method as in claim 6 in which the step of depositing the second layer includes sputter depositing TaN with a 1:X flow of Ar to $N_2$, where X is less than 1.

8. A method as in claim 6 in which the steps of depositing the first and second barrier layers include depositing the first and second barrier layers to have a combined thickness in the range of approximately 20 to 200 nm.

9. A method as in claim 8 in which the step of depositing the second barrier layer includes depositing the second barrier layer to a thickness in the range of approximately 10 to 100 nm.

10. A method as in claim 3 in which Step a) includes depositing TaN in a nitrogen rich environment, forming TaNx where 1<X<2, whereby barrier and adhesion properties are improved.

11. A method as in claim 1 in which Step b) includes depositing the Ir film at a temperature in the range of approximately 200 to 500 degrees C.

12. A method as in claim 1 in which Step b) includes selecting an Ir deposition method from the group consisting of PVD, CVD, and MOCVD.

13. A method as in claim 1 in which Step b) includes the Ir film being deposited at a thickness in the range of approximately 20 to 200 nm.

14. A method as in claim 1 in which Step c) includes depositing the Ti layer with deposition methods selected from the group consisting of PVD, MOCVD, and CVD).

15. A method as in claim 1 in which Step c) includes the Ti layer being deposited to a thickness in the range of approximately 5 to 25 nm.

16. A method as in claim 1 including a further step, following Step c), of:
   c1) annealing the layers deposited in Steps b) and c) at a temperature in the range of approximately 600 to 800 degrees C. in atmospheric conditions selected from the group consisting of Ar and vacuum ambient.

17. A method as in claim 1 wherein the substrate material is selected from the group of materials consisting of silicon, polysilicon, silicon dioxide, and silicon-germanium compounds.

18. A method as in claim 15 including a step, following Step c), of annealing at a temperature in the range of approximately 600 to 800 degrees C.

19. A method as in claim 18 including depositing a ferroelectric material overlying the Ti layer.

20. A method as in claim 15 in which the Ti layer deposited in Step c) is deposited using deposition methods selected from the group consisting of PVD, MOCVD, and CVD.

21. A method for forming a highly temperature stable conductive barrier overlying an integrated circuit substrate, the method comprising the steps of:
   a) depositing a first barrier layer including tantalum (Ta) overlying the substrate; and
   b) depositing an iridium (Ir) film overlying the first barrier layer;
   c) depositing a layer of titanium (Ti) overlying the Ir film, the Ti layer being deposited to a thickness in the range of approximately 5 to 25 nm; and
   d) depositing a ferroelectric material overlying the Ti layer.

22. A method as in claim 21 further including annealing at a temperature in the range of approximately 600 to 800 degrees C.

23. A method as in claim 21 in which Step b) includes the Ir film being deposited at a thickness in the range of approximately 20 to 200 nm.

24. A method as in claim 21 in which Step b) includes depositing the Ir film at a temperature in the range of approximately 200 to 500 degrees C.

* * * * *